United States Patent [19]
Hogan

[11] Patent Number: 5,901,157
[45] Date of Patent: May 4, 1999

[54] METHOD AND APPARATUS FOR REDUCING THE ACCESS TIME FOR STORAGE SYSTEMS

[75] Inventor: Josh Hogan, Los Altos, Calif.

[73] Assignee: Hewlett-Packard Company, Palo ALto, Calif.

[21] Appl. No.: 08/744,717

[22] Filed: Oct. 29, 1996

[51] Int. Cl.$^6$ .................................................. H03M 13/00
[52] U.S. Cl. ...................................... 371/37.01; 371/37.4
[58] Field of Search ............................. 371/37.01, 40.15, 371/37.4

[56] References Cited

U.S. PATENT DOCUMENTS

5,283,791  2/1994  Halford ................................... 371/40.4
5,285,451  2/1994  Henson ................................... 371/11.1

*Primary Examiner*—Stephen M. Baker

[57] ABSTRACT

Frequently only a portion of the data within an error correction data block is required to be changed or overwritten. For example in optical data storage on DVD type discs, an error correction block contains 32K bytes of user data, however, a computer system typically operates on 2K byte sectors and therefore frequently does not involve the full 32K byte block. In these circumstances the old data block must be read, error corrected, the new data combined with the old and new error correction redundancy bytes calculated. This invention is a method and apparatus of improving access time when only a portion of the data in an error correction data block is modified. The contributions to the redundancy bytes in the codewords, due to the old data to be modified and the new data to be written, are calculated. Required modifications to the old redundancy bytes can be calculated by parity checking (multiple exclusive or-ing), or by matrix operations and implemented by exclusive or-ing the modifications with the old redundancy bytes. This modification process need only involve the portion of the data that is to be modified and can make the new redundancy bytes available rapidly, thereby improving access time.

12 Claims, 5 Drawing Sheets

METHOD AND APPARATUS FOR REDUCING THE ACCESS TIME FOR STORAGE SYSTEMS

BACKGROUND OF THE INVENTION

1. Field of the Invention

The present invention relates to storage systems and, more particularly, to the reduction of access time to storage systems.

2. Description of the Related Art

When recording digital data, it is usual to group the user data into blocks and to protect the integrity of the data by adding error correction data. A commonly used scheme is Reed Solomon Product Code in which two levels of error correction codes (ECCs) are added. These two levels are often referred to as inner and outer error correction codes or ECC1 and ECC2.

Within a block, user data plus header information is arranged in an array of rows and columns. To each row is added an ECC1 code field and to each column is added an ECC2 code field. The resulting data block forms the minimum recordable block or unit record.

The host computer, however, may operate on smaller data segments or sectors. There are typically multiple sectors within a recordable block or unit record. When the host is to modify a sector, the drive typically reads the relevant block, error corrects the block, updates the block with the new sector of data, computes the error correction field values on this new block and writes the new unit record to the disc.

The process of calculating the new ECC, typically involves scanning the data along the rows as the data is being written to disc. ECC1 is calculated during this row scanning and appended to the data on disc. Meanwhile the ECC2 is gradually accumulated as the scanning progresses from row to row. This means that the ECC2 is not available until the complete data block has been scanned. It also means that even in situations where the unchanged data does not have to be rewritten, the complete data block has to be scanned to accumulate the new ECC2.

Furthermore, in some formats, e.g., the DVD format, ECC2 is interleaved throughout the data block, not appended at the end as is more usual. This means that writing cannot begin until ECC2 is available. On the inner tracks there is not sufficient time to read the data block, perform the complete scanning of the data block, necessary for calculating ECC2 in the conventional way and also to rewrite the new data block, in one revolution of the disc. This means an additional revolution is required to complete writing of the block.

Thus, it can be seen that multi-level error correction coding constraints, especially the interleaving of the error correction codes within a unit block, impose access limits upon current technology storage system devices and hinder the use of these devices in many applications.

Therefore, there is an unresolved need for multi-level error correction device that will significantly improve access time of current technology storage systems while providing reliable multi-level error correction, especially in the case of a device employing interleaving of the error correction codes within a unit block.

SUMMARY OF THE INVENTION

This invention is a multi-level error correction device and method that significantly improves access time of current technology storage systems while providing reliable multi-level error correction. As such, it is suitable for use when the error correction codes within a unit block are interleaved.

This invention is able to achieve improved access performance by calculating the "contribution" to the outer error correction code (ECC2) fields for the unit block of both the old sector to be changed and new replacement sector. The contribution due to the old is removed from the original ECC2 and that of the new is added to the original ECC2.

For one embodiment, calculation of the ECC2 contribution is accomplished by a matrix multiplication. The elements of the matrix are determined by which sector of the unit block is to be changed. Removing or adding a contribution to the original ECC2 is accomplished by a simple exclusive or process.

An alternative way of calculating the contribution to ECC2 of the sector is to accumulate the contribution while reading the original block. This is calculated in the same manner as is the normal ECC2, but zeros are substituted for all data bytes other than those of the sector to be changed.

Either way, this new approach allows the new ECC2 to be available in time for rewriting the updated sector on the same revolution that was used for the read operation. This removes an additional rotation of the disc and so improves access time.

This approach of removing and adding contributions to error correction codes is applicable to other recording situations. In general this approach means that, in addition to the error correction codes, only the data being changed need be processed. This provides both reduced data processing and improved access times.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–4. Those skilled in the art will readily appreciate that the detailed description given herein with respect to these figures is for explanatory purposes, however, because the invention extends beyond these limited embodiments.

Figure 1A:
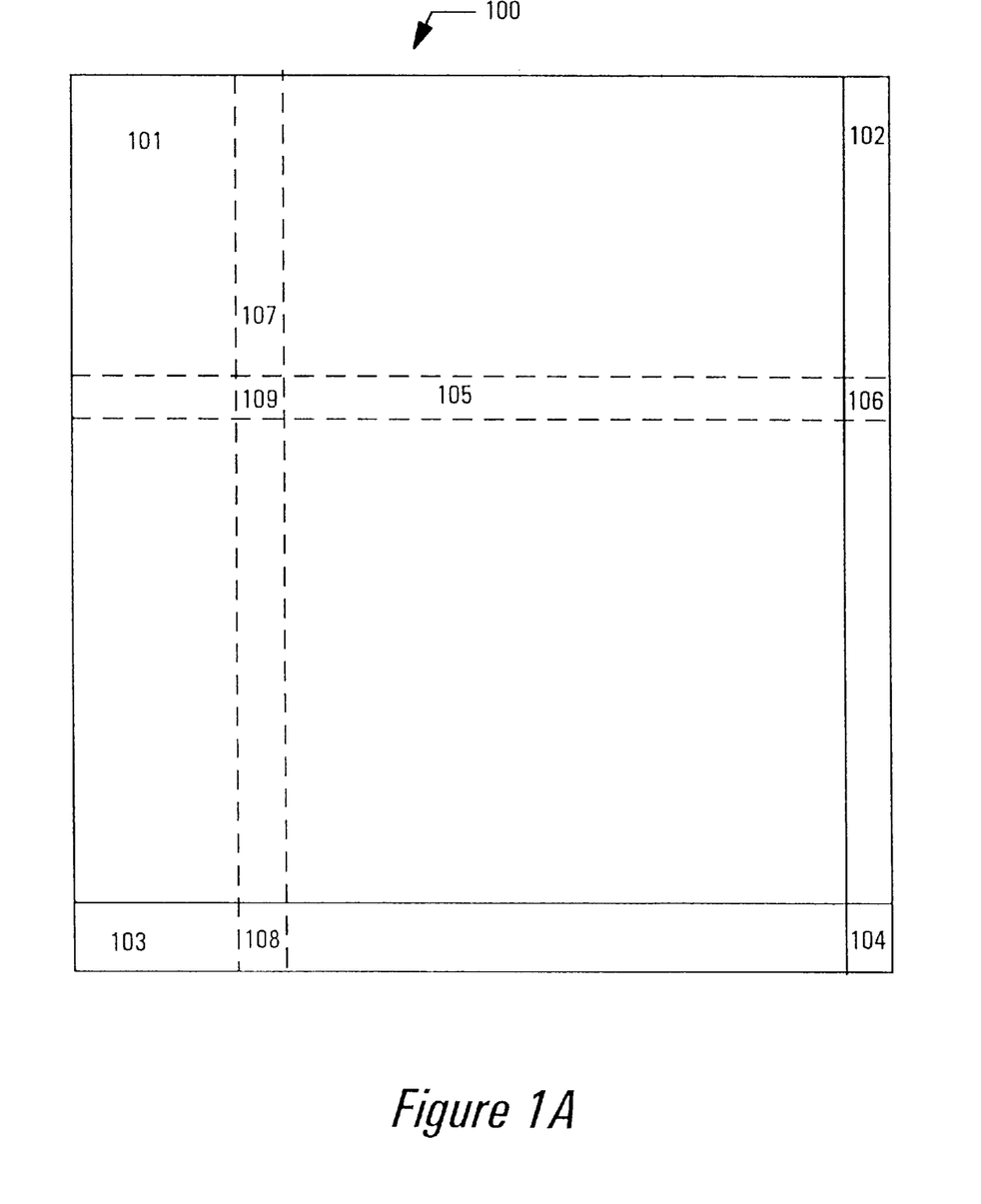
FIGS. 1A and 1B together illustrate the present invention using generalized representations of data block organizations employing an inner and outer error correction coding scheme.
Figure 1B:
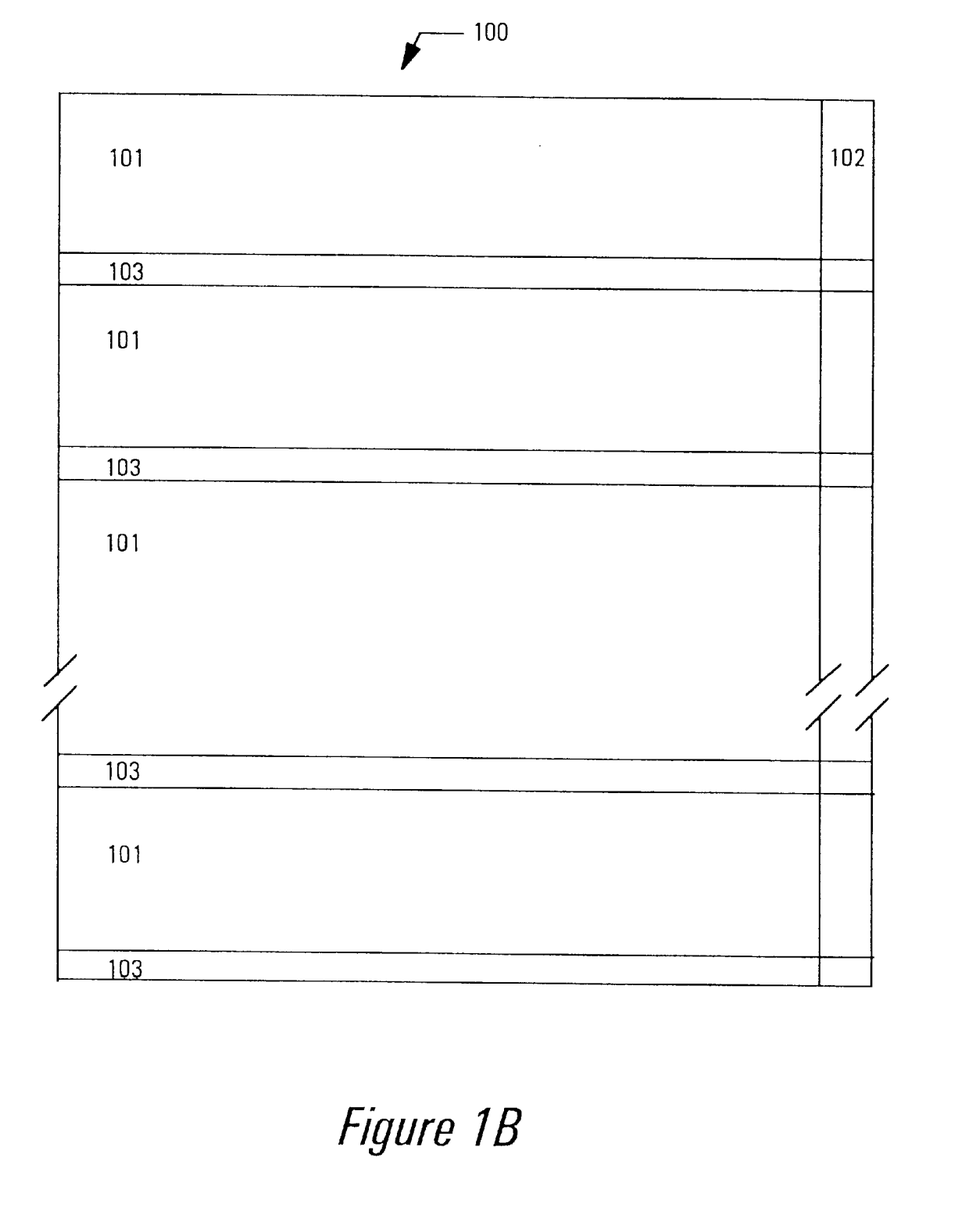

FIGS. 1A and 1B together illustrate the present invention using generalized representations of data block organizations employing an inner and outer error correction coding scheme. FIG. 1A illustrates a non-interleaved scheme and FIG. 1B illustrates an interleaved scheme. In FIG. 1A, unit block 100 is separated into user data (plus header information) area 101, inner correction code ECC1 area 102 and outer correction code ECC2 area 103. ECC1 area 102 and ECC2 area 103 intersect at area 104. Block 100 is scanned a row at a time, with each row having a corresponding ECC1 code field. For example, row 105 includes ECC1 code field 106. Each data unit of a row is part of a column having an associated ECC2 code field. Thus, data unit 109 of row 105 is part of column 107, which includes ECC2 code field 108.

In FIG. 1B, unit block 100 is separated into user data (plus header information) area 101, inner correction code ECC1 area 102 and outer correction code ECC2 area 103. However, as can be seen in FIG. 1B, throughout unit block 100 portions of the outer correction code ECC2 area 103 are interleaved with portions of user data (plus header information) area 101.

The DVD optical disk storage format uses such a scheme and can be used to illustrate a general problem associated with such multi-level error correction schemes. In the DVD case, 32 kbytes of user data plus header information is arranged in an array 172 bytes by 192 bytes. To each row of 172 bytes is added 10 bytes of ECC1 and to each column of 192 bytes is added 16 bytes of ECC2. The resulting data block, 182 by 208 bytes forms the minimum recordable block or unit record.

The host computer, however, may operate on smaller data segments, typically 2 kbytes. When the host is to modify a 2 kbyte sector, the drive typically reads the relevant 32 kbyte block, error corrects the block, updates the block with the new 2 kbytes of data, computes the error correction bytes on this new block and writes the new unit record to the disc.

The process of calculating the new ECC, typically involves scanning the data along the rows as the data is being written to disc. ECC1 is calculated during this row scanning and appended to the data on disc. Meanwhile the ECC2 is gradually accumulated as the scanning progresses from row to row. This means that the ECC2 is not available until the complete data block has been scanned. It also means that even in situations where the unchanged data does not have to be rewritten, the complete data block has to be scanned to accumulate the new ECC2.

In the DVD format, ECC2 is interleaved throughout the data block, not appended at the end as is more usual. In particular, one row of ECC2 is appended to each of the sixteen 2 kbyte sectors. This means that continuous writing cannot begin until ECC2 is available. On the inner DVD tracks there is not sufficient time to read the data block, perform the complete scanning of the data block, necessary for calculating ECC2 in the conventional way and also to rewrite the new data block, in one revolution of the disc. This means an additional revolution is required to complete writing the block.

The new approach involves calculating the "contribution" to ECC2 of both the old and new 2 kbyte sectors. The contribution due to the old is removed from the original ECC2 and that of the new is added to the original ECC2. This requires less processing and therefore can be performed more quickly.

Figure 2:
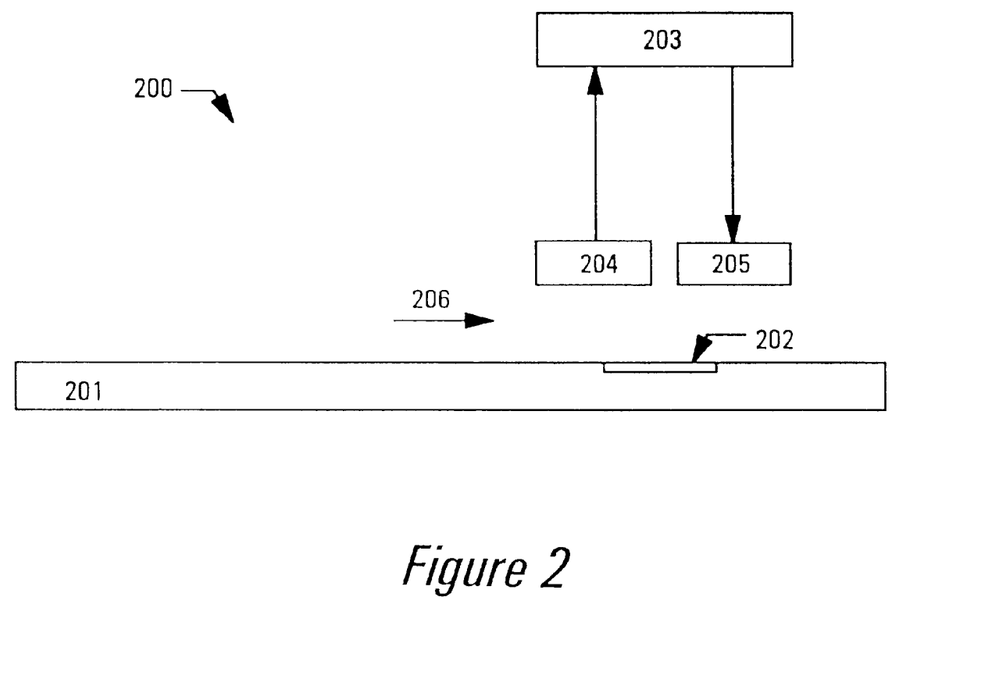
FIG. 2 is a side view of a storage system having an apparatus for reducing access time constructed according to an embodiment of the present invention.

FIG. 2 is a side view of a storage system having an apparatus for reducing access time constructed according to an embodiment of the present invention. Storage system 200 includes storage medium 201, a reading unit 204, a writing unit 205 and a controller 203. Storage medium 200 includes data block 202 and is moving in direction 201. For example, if storage medium 201 is a CD-ROM disc, it is rotating in direction 206. Alternately, if medium 201 is a tape, the tape is advancing in direction 206.

As unit block 204 passes reading unit 204, reading unit 204 scans unit block 204. This includes scanning old data to be changed. Controller 203 calculates contribution to a correction code from the old data to be changed, calculates contribution to the correction code from new data to replace the old data to be changed, and adjusts the correction code based upon a change in the correction code contribution. As unit block 202 passes writing unit 205, the new data and the adjusted correction code are written to unit block 202.

Figure 3:
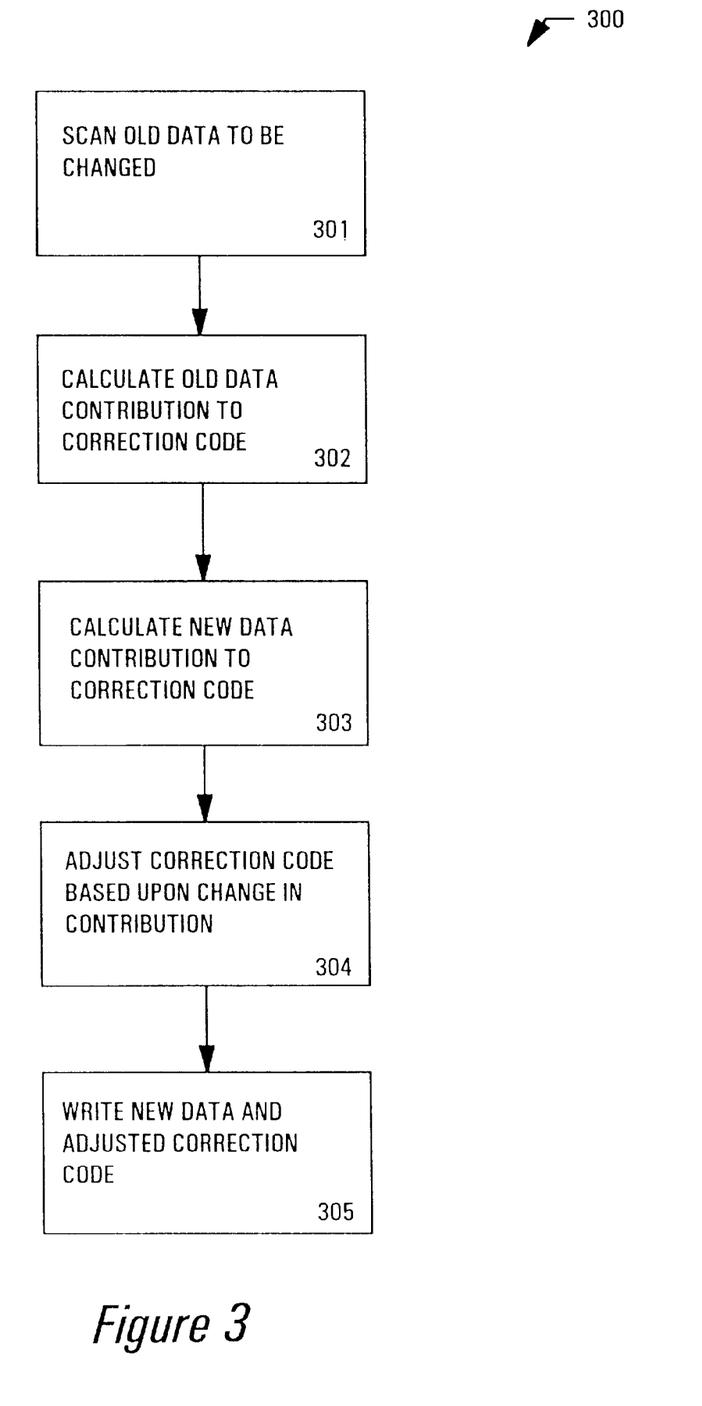
FIG. 3 is a flow chart illustrating a method for reducing storage system access time according to an embodiment of the present invention.

FIG. 3 is a flow chart illustrating a method for reducing storage system access time according to an embodiment of the present invention. In flow chart 300, old data to be changed is scanned (301). Contribution to a correction code from the old data to be changed is calculated (302). Contribution to the correction code from new data to replace the old data to be changed is calculated (303). The correction code is adjusted based upon a change in the correction code contribution (304). The new data and the adjusted correction code are written to the unit block (305).

For one embodiment, calculation of the ECC2 contribution is accomplished by a matrix multiplication. For example, in the DVD case, the elements of a 12×16 matrix are determined by which 2 kbyte sector of the unit block is to be changed. For one embodiment, removing or adding a contribution to the original ECC2 is accomplished by a simple exclusive or process.

An alternative way of calculating the contribution to ECC2 of the old sector to be changed is to accumulate the contribution while reading the original unit block. Thus, in the DVD case, the alternative way of calculating the contribution to ECC2 of the 2 kbyte sector to be changed is to accumulate the contribution while reading the original 32 kbyte block. This contribution calculation is done in the same manner as the normal ECC2 is calculated, only zeros are substituted for all data bytes other than those of the 2 kbyte sector to be changed.

This accumulation approach has an additional complication over that of the matrix multiplication approach. The complication occurs because the data read at the accumulation stage has only been subject to the ECC1 process and therefore may contain erasures or indeed errors (although there is additional error detection information to minimize this possibility). In any event, any erasures or errors in the old data to be changed can cause the ECC2 contribution calculation to be in error.

The calculated ECC2 contribution error can be corrected, however, by using the same technique of removing the contribution due to a row that is in error and adding the contribution of the corrected row. Alternately, the contribution error can be forestalled by setting this row having an error to all zeros during the accumulation process. This approach can be extended to removing and adding the contribution of single byte errors rather than rows.

Figure 4:
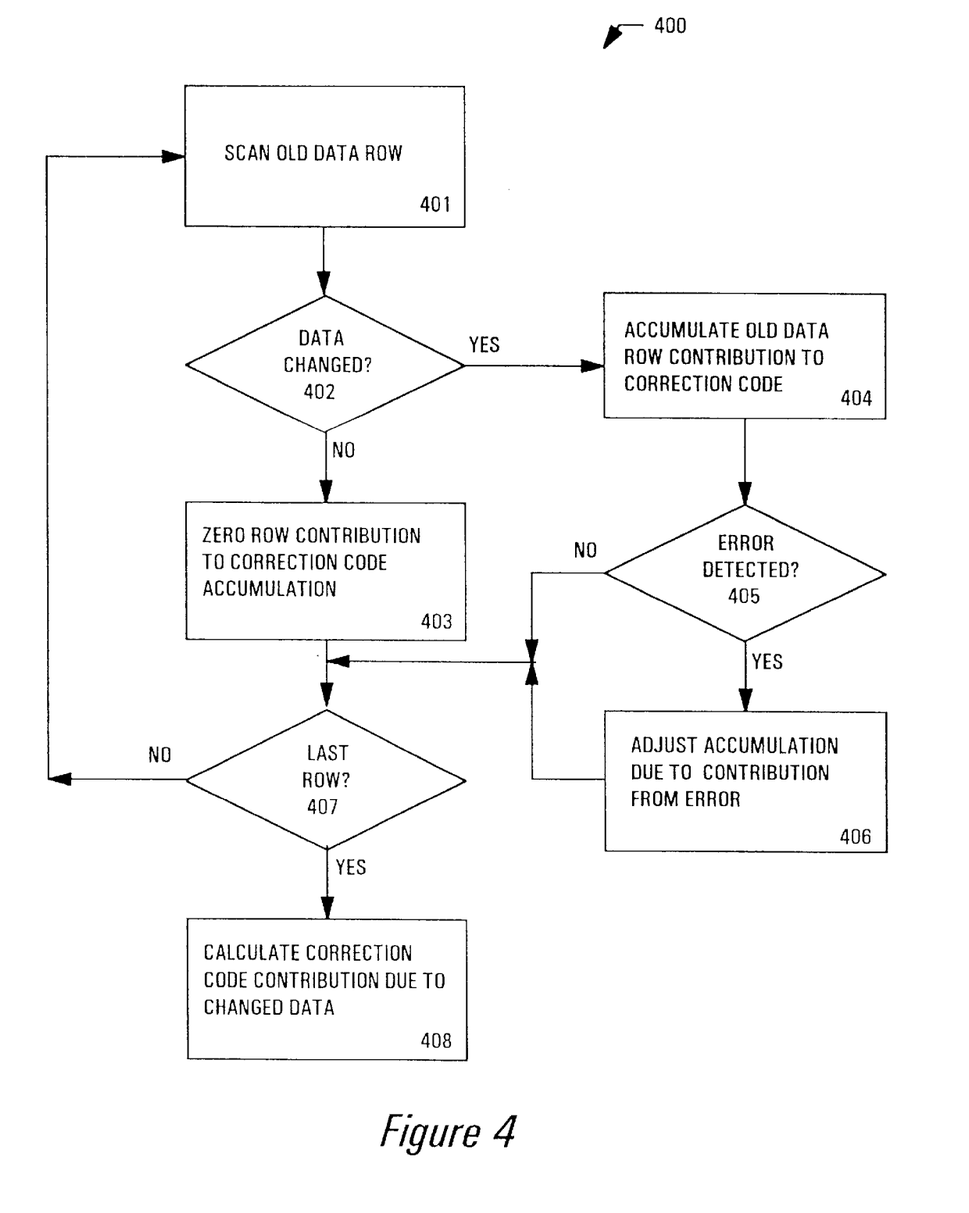
FIG. 4 is a flow chart illustrating a method for reducing storage system access time according to an alternate embodiment of the present invention.

FIG. 4 is a flow chart illustrating a method for reducing storage system access time according to an alternate embodiment of the present invention. Flow chart 400 begins with the scanning of an old data row (401). A test (402) is then made to determine whether the row scanned is a row from a sector having data to be changed. If the data of the row scanned is not to be changed, then zero row contribution is made to the correction code accumulation (403).

A test (407) is then made to determine whether the last row has been scanned. If the last row has not been scanned, then the next old data row is scanned (401). If on the other hand, the last row has been scanned, then the correction code contribution due to changed data is calculated (408).

Returning to decision box 402, if the data of the row scanned is to be changed, then the row contribution to the correction code accumulation is made (403). A test (405) is then made to determine whether an error in the row was detected. If no error is detected, then the last row test (407) is performed and processing proceeded as has been described. If an error is detected, however, then the contribution accumulation is adjusted by the contribution of the error (406) before the last row test (407) is performed.

The following example (intended only to illustrate the principle) uses codewords consisting of 8 data bytes (i.e., D1 through D8) and 4 ECC words (i.e., P1 through P4). Thus, for this example, the block length "N" is 12 symbols and the redundancy "R" is 4, which allows a correction power "t" of two symbols. The example uses the primitive polynomial $P(x)=x^8+x^7+x^2+x+1$ to generate GF(256).

The redundancy bytes P1, P2, P3 and P4 may be calculated using the generator matrix A and the 8 data bytes D1, D2, D3, D4, D5, D6, D7 and D8.

$$\begin{bmatrix} P1 \\ P2 \\ P3 \\ P4 \end{bmatrix} = \begin{bmatrix} A11 & A12 & A13 & A14 & A15 & A16 & A17 & A18 \\ A21 & A22 & A23 & A24 & A25 & A26 & A27 & A28 \\ A31 & A32 & A33 & A34 & A35 & A36 & A37 & A38 \\ A41 & A42 & A43 & A44 & A45 & A46 & A48 & A48 \end{bmatrix} \begin{bmatrix} D1 \\ D2 \\ D3 \\ D4 \\ D5 \\ D6 \\ D7 \\ D8 \end{bmatrix}$$

When calculating the contribution due to a limited number of data bytes, for example:

$$\begin{bmatrix} P1 \\ P2 \\ P3 \\ P4 \end{bmatrix} = \begin{bmatrix} A11 & A12 & A13 & A14 & A15 & A16 & A17 & A18 \\ A21 & A22 & A23 & A24 & A25 & A26 & A27 & A28 \\ A31 & A32 & A33 & A34 & A35 & A36 & A37 & A38 \\ A41 & A42 & A43 & A44 & A45 & A46 & A47 & A48 \end{bmatrix} \begin{bmatrix} 00 \\ 00 \\ D3 \\ D4 \\ 00 \\ 00 \\ 00 \\ 00 \end{bmatrix}$$

the matrix multiplication reduces to a simpler calculation:

$$\begin{bmatrix} P1 \\ P2 \\ P3 \\ P4 \end{bmatrix} = \begin{bmatrix} A13 & A14 \\ A23 & A24 \\ A33 & A34 \\ A43 & A44 \end{bmatrix} \begin{bmatrix} D3 \\ D4 \end{bmatrix}$$

Thus, assume the following original data and ECC wherein the four-byte codewords are represented in hexadecimal notation.

|  | D1 | D2 | D3 | D4 | D5 | D6 | D7 | D8 | P1 | P2 | P3 | P4 |
|---|---|---|---|---|---|---|---|---|---|---|---|---|
| Original data | 11 | 12 | 13 | 14 | 15 | 16 | 17 | 18 |  |  |  |  |
| with ECC | 11 | 12 | 13 | 14 | 15 | 16 | 17 | 18 | FB | 8C | 34 | 86 |

Suppose the host is to replace the third and fourth data code words (i.e., D3 and D4) with say 2F and 32, respectively.

|  | D1 | D2 | D3 | D4 | D5 | D6 | D7 | D8 | P1 | P2 | P3 | P4 |
|---|---|---|---|---|---|---|---|---|---|---|---|---|
| New data | 11 | 12 | 2F | 32 | 15 | 16 | 17 | 18 |  |  |  |  |
| with ECC | 11 | 12 | 2F | 32 | 15 | 16 | 17 | 18 | E3 | C9 | 5F | 4C |

However, ECC contribution accumulation solely from the old data to be changed and the new replacement data yields the following, respectively.

|  | D1 | D2 | D3 | D4 | D5 | D6 | D7 | D8 | P1 | P2 | P3 | P4 |
|---|---|---|---|---|---|---|---|---|---|---|---|---|
| Changed old | 00 | 00 | 13 | 14 | 00 | 00 | 00 | 00 | 85 | 48 | 58 | C9; |
| New | 00 | 00 | 2F | 32 | 00 | 00 | 00 | 00 | 9D | 0D | 33 | 03 |
| Also the old ECC |  |  |  |  |  |  |  |  | FB | 8C | 34 | 86 |
| Exclusive OR with the changed old contribution |  |  |  |  |  |  |  |  | 85 | 48 | 58 | C9 |
| yields |  |  |  |  |  |  |  |  | 7E | C4 | 6C | 4F |
| and Exclusive OR with the new contribution |  |  |  |  |  |  |  |  | 9D | 0D | 33 | 03 |
| yields |  |  |  |  |  |  |  |  | E3 | C9 | 5F | 4C | which is the required ECC for the new data and has been generated only using the changed data.

In this example, the ECC contributions can also be generated by the following matrix multiplication:

$$\begin{bmatrix} 85 \\ 48 \\ 58 \\ C9 \end{bmatrix} = \begin{bmatrix} X1 & Y1 \\ X2 & Y2 \\ X3 & Y3 \\ X4 & Y4 \end{bmatrix} \begin{bmatrix} 13 \\ 14 \end{bmatrix}$$

where the elements X and Y are determined by the location of the data bytes to be replaced.

Regardless of whether the contribution is calculated by matrix multiplication or accumulation, in the DVD case, the contribution calculation approach allows the new ECC2 to be available in time for rewriting the updated 32 kbyte on the same revolution that was used for the read operation. This removes an additional rotation of the disc and so improves access time.

The approach of removing and adding contributions to error correction codes is applicable to other recording situations, however. In general this contribution adjustment approach means that, in addition to the error correction codes, only the data being changed absolutely needs to be processed. The remaining unchanged data does not necessarily need to be processed in any way. Thus, one can design data storage architectures that exploit the ensuing reduced processing and improved access times.

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An error correction method, comprising the steps of:
   scanning old data to be changed;
   calculating contribution to a correction code from the old data to be changed;
   calculating contribution to the correction code from new data to replace the old data to be changed;
   adjusting the correction code based upon a change in the correction code contribution; and
   writing the new data and the adjusted correction code, wherein the contribution to the correction code from the old data to be changed is calculated using a matrix multiplication.

2. An error correction method, comprising the steps of:
   scanning old data to be changed;
   calculating contribution to a correction code from the old data to be changed;

calculating contribution to the correction code from new data to replace the old data to be changed;

adjusting the correction code based upon a change in the correction code contribution; and writing the new data and the adjusted correction code, wherein the contribution to the correction code from the new data is calculated using a matrix multiplication.

3. An error correction method, comprising the steps of:

scanning old data to be changed;

calculating contribution to a correction code from the old data to be changed;

calculating contribution to the correction code from new data to replace the old data to be changed;

adjusting the correction code based upon a change in the correction code contribution; and writing the new data and the adjusted correction code, wherein the adjusted correction code is calculated using the steps of:

calculating zeroed-row old data error code contribution for a row having zeros except in a portion where the old data will change;

calculating zeroed-row new data error code contribution for a row having zeros except in the portion where the old data will change and having the new data substituted for the old data in the portion where the old data will change; and performing an exclusive or operation between the zeroed-row old data error code contribution, the old data error code and the zeroed-row new data error code contribution.

4. The method as set forth in claim 3, further comprising the steps of:

determining whether a row having the old data was read correctly; and if an error was made, then removing the contribution due to the row that is in error and adding the contribution of the corrected data row.

5. The method as set forth in claim 3, further comprising the steps of:

determining whether the old data was read correctly; and if an error was made, then removing the contribution due to the data that is in error and adding the contribution of the corrected data.

6. An error correction method, comprising the steps of:

scanning old data to be changed;

calculating contribution to a correction code from the old data to be changed;

calculating contribution to the correction code from new data to replace the old data to be changed;

adjusting the correction code based upon a change in the correction code contribution; and writing the new data and the adjusted correction code, wherein the adjusted correction code is calculated using the steps of:

determining whether the old data was read correctly;

if no error was made, then calculating zeroed-row old data error code contribution for a row having zeros except in a portion where the old data will change;

if an error was made, then calculating zeroed-row old data error code contribution for a row having zeros except in a portion where the old data will change and having corrected old data substituted for the old data in the portion where the old data will change;

calculating zeroed-row new data error code contribution for a row having zeros except in the portion where the old data will change and having the new data substituted for the old data in the portion where the old data will change; and performing an exclusive or operation between the zeroed-row old data error code contribution, the old data error code and the zeroed-row new data error code contribution.

7. A storage system apparatus having error correction, comprising:

reading means for scanning old data to be changed;

controller means for calculating contribution to a correction code from the old data to be changed, calculating contribution to the correction code from new data to replace the old data to be changed, and adjusting the correction code based upon a change in the correction code contribution; and writing means for writing the new data and the adjusted correction code, wherein the contribution to the correction code from the old data to be changed is calculated using a matrix multiplication.

8. A storage system apparatus having error correction, comprising:

reading means for scanning old data to be changed;

controller means for calculating contribution to a correction code from the old data to be changed, calculating contribution to the correction code from new data to replace the old data to be changed, and adjusting the correction code based upon a change in the correction code contribution; and writing means for writing the new data and the adjusted correction code, wherein the contribution to the correction code from the new data is calculated using a matrix multiplication.

9. A storage system apparatus having error correction, comprising:

reading means for scanning old data to be changed;

controller means for calculating contribution to a correction code from the old data to be changed, calculating contribution to the correction code from new data to replace the old data to be changed, and adjusting the correction code based upon a change in the correction code contribution; and writing means for writing the new data and the adjusted correction code, wherein the controller means calculates the adjusted correction code by:

calculating zeroed-row old data error code contribution for a row having zeros except in a portion where the old data will change;

calculating zeroed-row new data error code contribution for a row having zeros except in the portion where the old data will change and having the new data substituted for the old data in the portion where the old data will change; and performing an exclusive or operation between the zeroed-row old data error code contribution, the old data error code and the zeroed-row new data error code contribution.

10. The apparatus as set forth in claim 9, wherein the controller means further:

determines whether a row having the old data was read correctly; and if an error was made, then removes the contribution due to the row that is in error and adds the contribution of the corrected data row.

11. The apparatus as set forth in claim 9, wherein the controller means further:

determines whether the old data was read correctly; and if an error was made, then removes the contribution due to the data that is in error and adds the contribution of the corrected data.

12. A storage system apparatus having error correction, comprising:

reading means for scanning old data to be changed;

controller means for calculating contribution to a correction code from the old data to be changed, calculating contribution to the correction code from new data to replace the old data to be changed, and adjusting the correction code based upon a change in the correction code contribution; and writing means for writing the new data and the adjusted correction code, wherein the controller means calculates the adjusted correction code by:

determining whether the old data was read correctly;

if no error was made, then calculating zeroed-row old data error code contribution for a row having zeros except in a portion where the old data will change;

if an error was made, then calculating zeroed-row old data error code contribution for a row having zeros except in a portion where the old data will change and having corrected old data substituted for the old data in the portion where the old data will change;

calculating zeroed-row new data error code contribution for a row having zeros except in the portion where the old data will change and having the new data substituted for the old data in the portion where the old data will change; and performing an exclusive or operation between the zeroed-row old data error code contribution, the old data error code and the zeroed-row new data error code contribution.

* * * * *